US006033924A

United States Patent [19]

Pack et al.

[11] Patent Number: 6,033,924

[45] **Date of Patent: *Mar. 7, 2000**

[54] METHOD FOR FABRICATING A FIELD EMISSION DEVICE

[75] Inventors: Sung P. Pack, Tempe; Babu R. Chalamala, Chandler, both of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/900,095

[22] Filed: Jul. 25, 1997

[51] Int. Cl.[7] .................................................... H01L 21/00

[52] U.S. Cl. ............................ 438/20; 257/163; 257/164; 257/165; 257/166; 313/230; 313/309; 313/336; 313/346 R; 313/347; 313/346 DC; 313/355; 445/50; 445/51; 445/58

[58] Field of Search ...................... 438/20; 257/163–166; 313/230, 309, 336, 346 R, 347, 346 DC, 355; 445/50, 51, 58

[56] References Cited

U.S. PATENT DOCUMENTS

| | | | |
|---|---|---|---|
| 5,089,292 | 2/1992 | MaCaulay et al. . | |
| 5,141,460 | 8/1992 | Jaskie et al. . | |
| 5,258,685 | 11/1993 | Jaskie et al. . | |
| 5,905,334 | 5/1999 | Nakamura et al. | 313/491 |
| 5,921,838 | 7/1999 | Pack et al. | 445/50 |

OTHER PUBLICATIONS

"Energy Distributions of Field Emitted Electrons from Carbide Tips and Tungsten Tips with Diamondlike Carbon Coatings" by Yu et al., J. Vac. Sci. Technol. B 14(6), Nov /.Dec 1996, pp. 3797–3801.

"Cesiated Thin–film Field–emission Microcathode Arrays" by Macaulay et al., Appl. Phys. Lett. 61 (8), Aug. 24, 1992, pp. 997–999.

"Electron Emission Enhancement by Overcoating Molybdenum Field–emitter Arrays with Titanium, Zirconium, and Hafnium" by Schwoebel et al., J. Vac. Sci. Technol. B 13(2), Mar./Apr. 1995, pp. 338–343.

"Hafnium Carbide Films and Film–Coated Field Emission Cathodes" by Mackie et al., 9th International Vacuum Microelectronics Conference, St. Petersburg 1996, pp. 240–244.

"Enhancement of Electron Emission Efficiency and Stability of Molybdenum–tip Field Emitter Array by Diamond Like Carbon Coating" by Jae Hoon Jung et al., *IEEE Electron Device Letters*, vol. 18. No. 5, May 1997, pp. 197–199.

"Field Emission from ZrC films on Si and Mo Single Emitters and Emitter Arrays" by Xie et al., J. Vac. Sci. Technol. B 14(3). May/Jun. 1996, pp. 2090–2092.

*Primary Examiner*—John F. Niebling
*Assistant Examiner*—David Zarneke
*Attorney, Agent, or Firm*—Jasper Dockrey; S. Kevin Pickens; Kevin D. Wills

[57] ABSTRACT

A method for fabricating a field emission device (200) includes the steps of forming on the surface of a substrate (110) a cathode (112), forming on the cathode (112) a dielectric layer (114), forming an emitter well (115) in the dielectric layer (114), forming within the emitter well (115) an electron emitter structure (118) having a surface (123), forming on a portion of the dielectric layer (114) a gate electrode (116), depositing on the dielectric layer (114) a sacrificial layer (210), thereafter depositing on the surface (123) of the electron emitter structure (118) a coating material (220, 320, 420) that has an emission-enhancing material, and then removing the sacrificial layer (210).

17 Claims, 2 Drawing Sheets

-PRIOR ART-

300

400

400

METHOD FOR FABRICATING A FIELD EMISSION DEVICE

FIELD OF THE INVENTION

The present invention pertains to the area of the fabrication of field emission devices and, more particularly, to methods for coating the surfaces of the electron emitter structures of field emission devices.

BACKGROUND OF THE INVENTION

It is known in the prior art to form emission-enhancing coatings on the surfaces of electron emitter structures of field emission devices. These prior art coatings are employed to improve the emission current characteristics of the field emission device. Typically, the electron emitters are Spindt-tip structures made from molybdenum, and the emission-enhancing coating is a metal that is selected for its low work function, which is less than that of the molybdenum. The surface work function of molybdenum is about 4.6 eV. Processes for forming electron emitter structures, such as Spindt tips, from molybdenum are well known in the art.

Prior art emission-enhancing coatings are known to be made from a pure metal selected from the following: sodium, calcium, barium, cesium, titanium, zirconium, hafnium, platinum, silver, and gold. Also known are emission-enhancing coatings made from the carbides of hafnium and zirconium. These prior art coatings are known to improve the emission current characteristics of field emission electron emitters. However, these prior art coatings suffer from several disadvantages. For example, many have high electrical conductivities, which can cause electrical shorting between the individual gate electrodes and between the gate electrodes and cathodes However, prior art methods for depositing these emission-enhancing coatings typically include blanket depositions over the entire cathode plate. This results in the deposition of emission-enhancing material between the gate extraction electrodes, which extract electrons from the electron emitters. These methods are not suitable for the coating of electron emitter structures of selectively addressable arrays of field emitters, such as are employed in field emission displays. In one prior art method for coating electron emitter structures with cesium, electrical conduction between the gate electrode and the cathode is mitigated by carefully controlling the thickness of the cesium layer.

It is also known in the art to coat electron emitters with films made from diamond-like carbon (DLC). This prior art coating is similarly employed for the purpose of reducing the work function of the surface of the electron emitters. In one prior art method for coating electron emitters with DLC, the selective deposition of the emissive DLC material is achieved by first forming nucleation sites on the surfaces of the electron emitters The nucleation sites are formed by selectively implanting carbon ions into the surfaces of the electron emitter structures, and not between the gate electrodes. The cathode surface is then exposed to a reactant material, which preferentially reacts at the nucleation sites to form the DLC, thereby mitigating deposition of the coating material between gate electrodes. However, this prior art method for localizing the coating material at the electron emitters is limited to the formation of DLC.

Accordingly, there exists a need for an improved method for coating electron emitters of a field emission device, which is useful for a variety of emission-enhancing coating materials, which does not cause adverse electrical conduction between individual gate electrodes and between the gate electrodes and the cathode electrodes, and which allows for variability of the thickness of the emission-enhancing coating.

Figure 1:
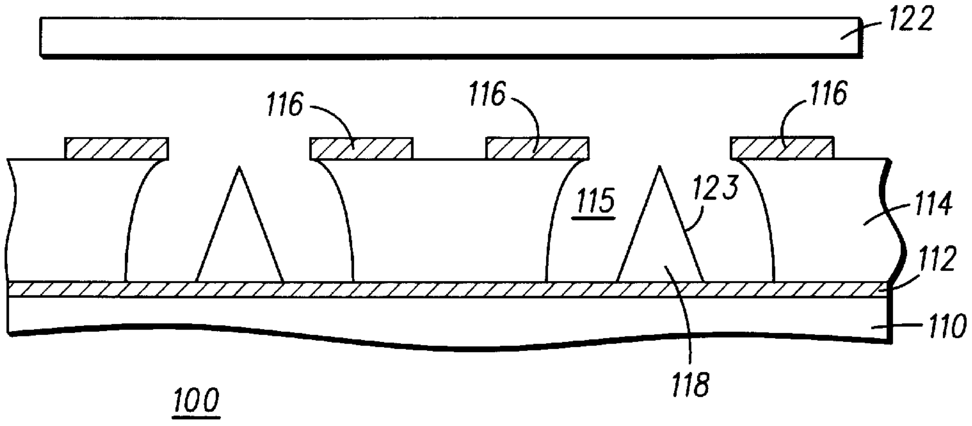
FIG. 1 is a cross-sectional view of a prior art field emission device.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DESCRIPTION OF THE PREFERRED EMBODIMENTS

The method of the invention includes the steps of depositing a sacrificial (lift-off) layer on the dielectric layer of a field emission device, thereafter depositing on the electron emitter structures a coating material having an emission-enhancing material or a precursor of an emission-enhancing material, and then removing the sacrificial layer, so that the emission-enhancing material remains only on the electron emitter structures. The method of the invention mitigates electrical shorting problems between the gate electrodes of the device due to the emission-enhancing material. The method of the invention also provides for the deposition of emission-enhancing materials that are not conveniently deposited by standard vapor deposition techniques, such as electron beam evaporation, sputtering, plasma-enhanced chemical vapor deposition, and the like. The method of the invention also permits variability of the thickness of the emission-enhancing coatings. In this manner, very thin films can be formed, such as monolayers that enhance emission from the underlying electron emitter structure; thicker films can also be formed, so that emission is primarily from the emission-enhancing coating. The latter configuration is useful for a coating material having a work function that is less than the work function of the underlying electron emitter structure.

FIG. 1 is a cross-sectional view of a prior art field emission device (FED) 100. FED 100 includes a substrate 110, which is made from a hard material, such as glass, quartz, and the like. A cathode 112 is formed on substrate 110 and is made from a conductive material, such as molybdenum, aluminum, and the like. A dielectric layer 114 is formed on cathode 112 using standard deposition techniques, and it is made from a dielectric material, such as silicon dioxide, silicon nitride, and the like. A plurality of emitter wells 115 are formed within dielectric layer 114. An electron emitter structure 118 is formed within each of emitter wells 115. Electron emitter structure 118 typically has a conical shape and typically includes a Spindt tip, which is made from molybdenum. Methods for forming Spindt tips are known to one skilled in the art. FED 100 further includes a plurality of gate electrodes 116, which are made from a conductive material, such as molybdenum, aluminum, and the like. Gate electrodes 116 are patterned to provide selective addressability of electron emitter structures 118. FED 100 also includes an anode 122, which is spaced from electron emitter structures 118 and is designed to receive electrons emitted therefrom.

Figure 2:
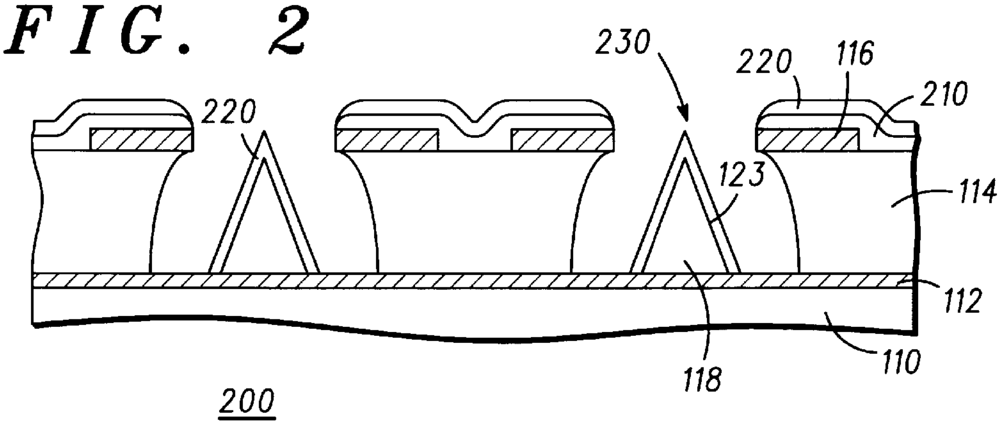
FIGS. 2 and 3 are cross-sectional views of a first embodiment of a field emission device fabricated in accordance with the invention.
Figure 3:
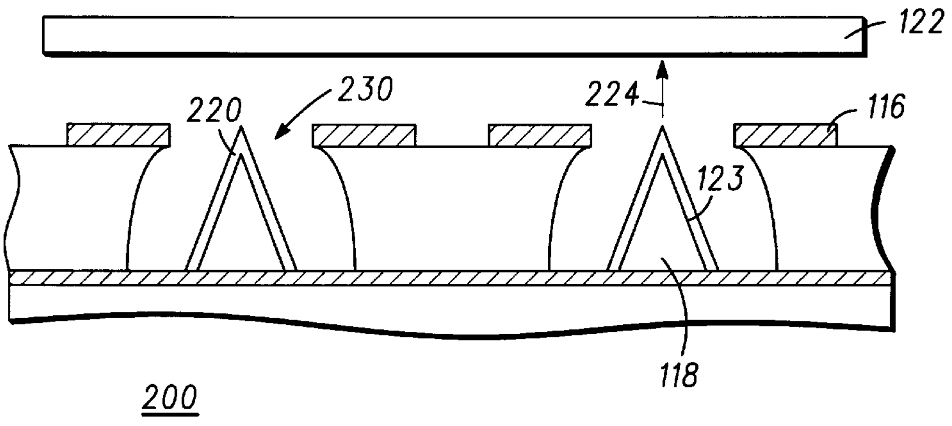

The method of the invention includes steps for forming an emission-enhancing coating on electron emitter structures 118. FIGS. 2 and 3 are cross-sectional views of a field emission device (FED) 200 fabricated in accordance with the invention. FED 200 includes the elements of FED 100 and further includes a coating material 220, which is disposed on electron emitter structures 118.

Referring to FIG. 2, FED 200 is fabricated by first forming FED 100, as described with reference to FIG. 1 Thereafter, a sacrificial layer 210 is selectively deposited onto the horizontal surfaces of dielectric layer 114 and on gate electrodes 116. Sacrificial layer 210 is made from a material that can be selectively removed subsequent to the deposition of coating material 220. Selective deposition of sacrificial layer 210 onto the surfaces of dielectric layer 114, which are between gate electrodes 116, and onto gate electrodes 116 is achieved by employing an angled evaporation of the sacrificial material. The sacrificial material is preferably made from a metal selected from a group consisting of aluminum, zinc, copper, tin, titanium, vanadium, and silver.

After the formation of sacrificial layer 210, coating material 220 is deposited using a generally normal (90° with respect to the plane defined by dielectric layer 114) deposition onto a surface 123 of electron emitter structures 118 and onto sacrificial layer 210. An electron emitter 230 is thus formed and includes electron emitter structure 118 and that portion of coating material 220 that is deposited on surface 123 of electron emitter structure 118. The normal deposition lessens the deposition of the coating material onto the surfaces of dielectric layer 114 that define emitter wells 115. In this manner electrical shorting problems between gate electrodes 116 and cathode 112 are reduced.

In the embodiment of FIGS. 2 and 3, coating material 220 is made from an emission-enhancing material that can be deposited by standard vapor deposition techniques, such as evaporation, electron beam evaporation, sputtering, plasma-enhanced chemical vapor deposition, and the like. Such emission-enhancing materials include, but are not limited to: gold, platinum, palladium, cesium, barium, calcium, hafnium, zirconium, titanium, hafnium carbide, molybdenum carbide, zirconium carbide, and the like. In accordance with the method of the invention, the coating material preferably includes a metallic chemical element Subsequent to the deposition of coating material 220, sacrificial layer 210 is removed, thereby also removing overlying coating material 220. An exemplary material for sacrificial layer 210 is aluminum, the selective etching of which is known to one skilled in the art. In this manner, and as illustrated in FIG. 3, the emission-enhancing material is not deposited between adjacent gate electrodes 116. Thus, in contrast to the prior art, electrical shorting problems due to the emission-enhancing material are mitigated. Then, anode 122 is assembled with the cathode plate, as depicted in FIG. 3.

The thickness of coating material 220 is controlled by controlling the deposition parameters. Such control methods are known to one skilled in the art. The thickness of coating material 220 depends on the properties of electron emitter structures 118 and coating material 220, and it is preferably within a range of about 50–500 angstroms, so that the surface of electron emitter 230 is defined by coating material 220, and so that electron emission is from coating material 220.

In general, a very thin film can be employed to enhance emission from electron emitter structure 118, whereas a thicker film can be employed to provide electron emission from coating material 220. The latter configuration is particularly useful for coating material 220 having a work function that is less than that of electron emitter structure 118. Electron emission is indicated in FIG. 3 by an arrow 224.

In the preferred embodiment, electron emitter structure 118 is made from molybdenum, and coating material 220 is made from a material having a work function that is less than the work function of the molybdenum. The work function of molybdenum is about 4.6 eV.

Table 1 below tabulates exemplary emission-enhancing materials that can be employed in the step of depositing on the surface of an electron emitter structure a coating material, in accordance with the method of the invention. Also tabulated in Table 1 are the work functions for these emission-enhancing materials. The work function data of Table 1 is extracted from the *Handbook of Thermionic Properties* by V. S. Fomenko, Plenum Press, New York, 1966. Because the work function of a particular surface depends, in part, upon the configuration of the lattice plane at the emissive surface, some of the materials listed in Table 1 have corresponding thereto several values for the work function The work functions of the tabulated materials are less than that of molybdenum. Exemplary emission-enhancing materials that can be deposited by the method described with reference to FIGS. 2 and 3 are: oxides of the lanthanides ($La_2O_3$, $Ce_2O_3$, $Pr_2O_3$, etc.), $In_2O_3$, $IrO_2$, $RuO_2$, PdO, $SnO_2$, $ReO_3$, $In_2O_3$:$SnO_2$, $BaTiO_3$, $BaCuO_x$, $Bi_2Sr_2CaCu_2O_x$, $YBa_2Cu_3O_{7-x}$, and $SrRuO_3$, where x is an integer. In addition to the lower work function characteristics, these emission-enhancing oxides have passivation characteristics, which protect the electron emitters from poisonous gases present in the vacuum environment of the field emission device.

TABLE 1

Work Functions of Selected Materials Useful for the Coating Material of the Invention

| Oxide of Passivation Layer | Work Function (eV) | Oxide of Passivation Layer | Work Function (eV) |
|---|---|---|---|
| BaO | 1.0–1.7 | $Pm_2O_3$ | 3.3 |
| $Ba_3WO_6$ | 2.4–2.8 | $Eu_2O_3$ | 2.6–3.6 |
| SrO | 1.2–2.6 | $Gd_2O_3$ | 2.1–3.1 |
| $Sc_2O_3$ | 4.4 | $Tb_2O_3$ | 2.1, 2.3, 2.9, 3.3 |
| TiO | 2.96–3.1 | $Dy_2O_3$ | 2.1–3.2 |
| $Y_2O_3$ | 2.0–3.87 | $Ho_2O_3$ | 2.3–3.2 |
| $ZrO_2$ | 3.1–4.1 | $Er_2O_3$ | 2.4–3.3 |
| $Lu_2O_3$ | 2.3–3.86 | $Tm_2O_3$ | 3.27 |
| $HfO_2$ | 2.8, 3.6, 3.8 | $Yb_2O_3$ | 2.7–3.39 |
| $La_2O_3$ | 2.8–3.81 | $ThO_2$ | 1.6–3.7 |
| $Ce_2O_3$ | 3.21, 4.20 | $xBaO.HfO_2$ | 2.1–2.2 |
| $Pr_2O_3$ | 2.8, 3.48, 3.68 | (Ba, Sr)O | 1.2 |
| $Nd_2O_3$ | 2.3–3.3 | $(BaO)n.(Ta_2O_3)_m$ | 2.3–3.9 |

In accordance with the method of the invention, electron emitter structures can also be coated with emission-enhancing materials that are not conveniently deposited by standard vapor deposition techniques, as described with reference to FIGS. 2 and 3. These emission-enhancing materials include, but are not limited to, $RuO_2$ and $ReO_3$. Methods, which are described below with reference to FIGS. 4–6, in accordance with the invention, are particularly useful for the deposition of these types of emission-enhancing materials.

Figure 4:
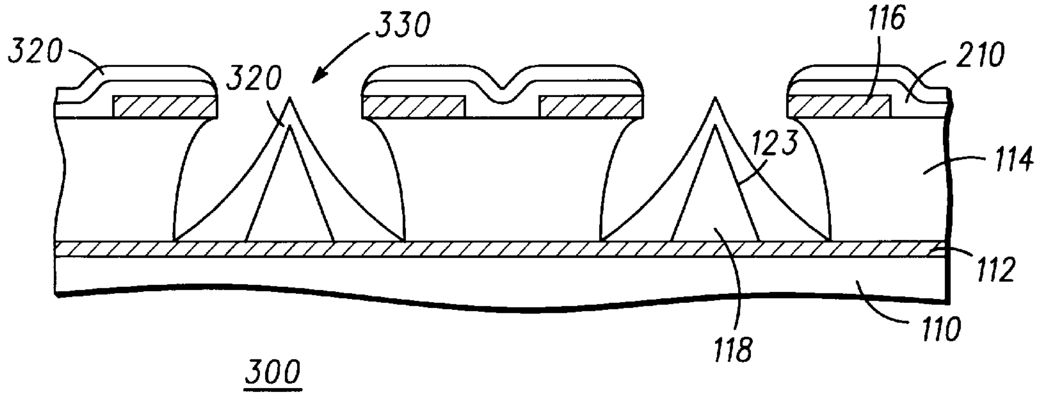
FIG. 4 is a cross-sectional view of a second embodiment of a field emission device fabricated in accordance with the invention.

FIG. 4 illustrates a cross-sectional view of an FED 300, which is fabricated in accordance with the method of the invention. The fabrication of the embodiment of FIG. 4 includes the step of depositing onto surfaces 123 of electron emitter structures 118 and onto sacrificial layer 210 a coating material 320. Coating material 320 is made by first dispersing an emission-enhancing material or a precursor thereof in a liquid carrier. In the example of FIG. 4, the liquid carrier is an organic spreading liquid medium. The organic spreading liquid medium is a liquid organic material, such as an alcohol, acetone, other organic solvent, or a photoresist, which is capable of being selectively removed from coating material 320 subsequent to its deposition onto the cathode plate. Emission-enhancing materials that are contemplated for deposition using an organic spreading liquid medium include, but are not limited to, $RuO_2$, $ReO_3$, intermetallic oxides, organometallic compounds, and the like.

After the emission-enhancing material or precursor thereof is dispersed within the organic spreading liquid medium, the liquid mixture is applied to the surface of the cathode plate by a convenient deposition method, such as roll-coating, spin-on coating, and the like. During this deposition step, the liquid mixture coats electron emitter structures 118 and sacrificial layer 210.

After the deposition of coating material 320, the organic spreading liquid medium is removed therefrom. In the preferred embodiment the removal of the organic spreading liquid medium is achieved by an ashing procedure, which includes burning the organic spreading liquid medium by exposure to a plasma, thereby realizing an electron emitter 330, which includes electron emitter structure 118 and the coating of the emission-enhancing material formed thereon. After the removal of the organic spreading liquid medium, sacrificial layer 210 is selectively removed by a selective etching procedure. Then, the cathode plate is assembled with an anode (not shown).

In the example of FIG. 4, the thickness of the final, emission-enhancing coating is determined by the concentration of the emission-enhancing material or precursor thereof in the organic spreading liquid medium. A low concentration can be used to form a very thin coating. A very thin coating results in electron emitter 330 having a surface that is defined by the emission-enhancing material and by electron emitter structure 118. For example, a very thin coating may include one monolayer of the emission-enhancing material. In the preferred embodiment, the concentration is predetermined so that the final coating is thick enough to define the surface of electron emitter 330. In this latter configuration, electron emission is only from the emission-enhancing material that defines coating material 320. This configuration is particularly useful for emission-enhancing materials having work functions that are less than that of electron emitter structure 118. The thickness of these thicker coatings is greater than about 100 angstroms.

When a precursor of an emission-enhancing material is used in the embodiment of FIG. 4, the precursor of the emission-enhancing material is converted to the corresponding emission-enhancing material subsequent to the deposition of the liquid mixture onto the cathode plate. An exemplary precursor of an emission-enhancing oxide is an organometallic material, which has a metallic chemical element that forms an emission-enhancing oxide. The metallic chemical element of the precursor is converted to the emission-enhancing oxide during the step of removing the organic spreading liquid medium Specifically, during the plasma ashing step, the metallic chemical element of the organometallic material is oxidized. By way of example, organometallic precursors useful for the formation of $RuO_2$ are dodecacarbonyltriruthenium [$Ru_3(CO)_{12}$] and ruthenium (III)2,4-pentanedionate [$Ru(C_5H_7O_2)_3$]; an organometallic precursor useful for the formation of $ReO_3$ is decacarbonyldirhenium [$Re_2(CO)_{10}$].

Certain emission-enhancing materials that can be deposited using a liquid carrier, such as described with reference to FIG. 4, are conductive enough to result in electrical shorting problems if they are deposited on or proximate to the surfaces of dielectric layer 114 that define emitter wells 115. These conductive emission-enhancing materials can also be selectively deposited onto electron emitter structures by a method in accordance with the invention and as described with reference to FIGS. 5 and 6.

Figure 5:
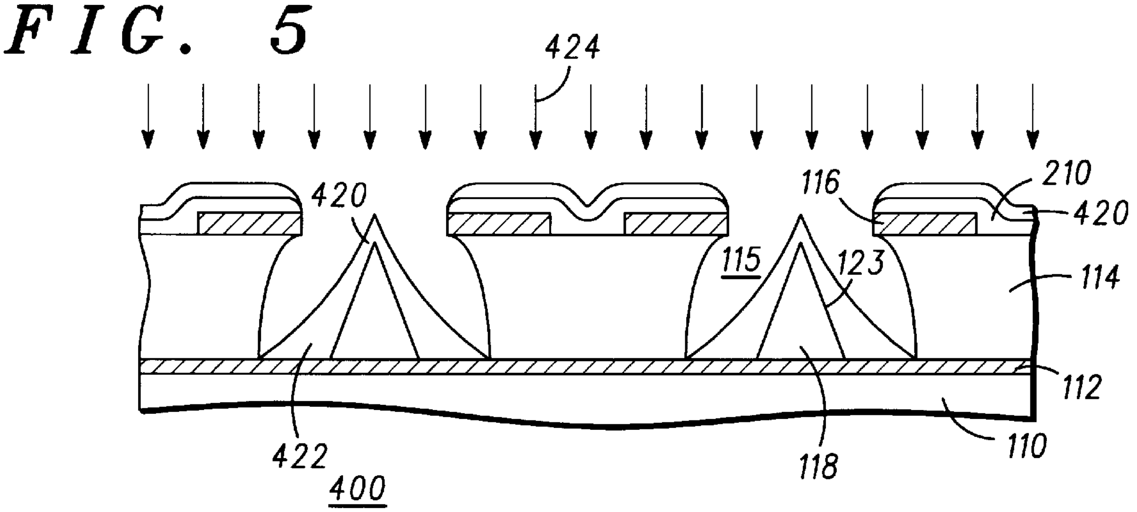
FIGS. 5 and 6 are cross-sectional views of a third embodiment of a field emission device fabricated in accordance with the invention.
Figure 6:
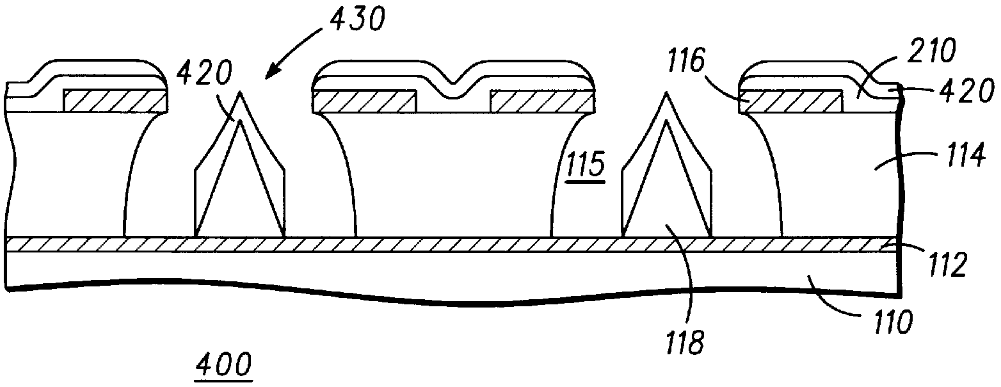

Illustrated in FIGS. 5 and 6 are cross-sectional views of a FED 400 having a coating material 420, which contains a conductive emission-enhancing material. Coating material 420 is formed by first dispersing the conductive emission-enhancing material into a photo active liquid, such as a negative photoresist material. This mixture is deposited onto the cathode plate by a convenient liquid deposition method, such as roll-coating, spin-on coating, and the like. The deposition step generally coats sacrificial layer 210 and electron emitter structures 118. However, some of the coating material may form a foot portion 422 at the base of each of emitter wells 115 and/or may be deposited along the walls defining emitter wells 115.

If they are not removed, these portions of coating material 420 may result in electrical shorting problems between cathode 112 and gate electrodes 116, due to the conductive nature of the emission-enhancing material. In accordance with the invention, these portions can be removed by first photo-exposing the cathode plate to collimated light having a wavelength suitable for activating the negative photoresist. The wavelength of the light is selected to match the absorption characteristics of the photoactive spreading liquid. The collimated light is directed toward the cathode plate in a direction generally normal to the plane of the cathode plate, as illustrated by a plurality of arrows 424 in FIG. 5. During the photo-exposure step, the upper protruding portion of the structure defining each of emitter wells 115 masks foot portion 422 and any coating material on the walls of emitter wells 115 from the collimated light.

After the photo-exposure step, coating material 420 is developed, thereby removing the portions of coating material 420 that were not photo-exposed, as illustrated in FIG. 6. Thereafter, the negative photoresist is removed from coating material 420, as by plasma ashing. In this manner an electron emitter 430, which includes electron emitter structure 118 and the emission-enhancing material formed thereon, is realized. After the removal of the negative photoresist, sacrificial layer 210 is removed. Subsequent to the removal of sacrificial layer 210, the cathode plate is assembled with an anode (not shown). Examples of conductive emission-enhancing materials that can be deposited in the manner described with reference to FIGS. 5 and 6 include $RuO_2$, PdO, $SnO_2$, $ReO_3$, $IrO_2$, and the like. The thickness of the final configuration of coating material 420 is determined in a manner similar to that described with reference to FIG. 4.

In summary, the method of the invention includes steps for selectively coating electron emitter structures with an emission-enhancing material. The method of the invention mitigates electrical shorting problems between individual gate electrodes. The method of the invention also mitigates electrical shorting problems due to the emission-enhancing material between the cathode electrodes and the gate electrodes. The method of the invention further provides for the deposition of emission-enhancing materials that are not conveniently deposited by standard deposition techniques.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

It is claimed:

1. A method for fabricating a field emission device comprising the steps of:

providing a substrate having a surface;

forming on the surface of the substrate a cathode;

forming on the cathode a dielectric layer;

forming an emitter well in the dielectric layer;

forming within the emitter well an electron emitter structure having a surface;

forming on a portion of the dielectric layer a gate electrode;

depositing on the dielectric layer a sacrificial layer;

subsequent to the step of depositing the sacrificial layer, depositing on the surface of the electron emitter structure a coating material having passivation characteristics including a metallic oxide; and thereafter, removing the sacrificial layer.

2. The method for fabricating a field emission device as claimed in claim 1, wherein the step of depositing a coating material includes the step of depositing a coating material including an organic spreading liquid medium, and further including, subsequent to the step of depositing a coating material and prior to the step of removing the sacrificial layer, the step of removing the organic spreading liquid medium from the coating material.

3. The method for fabricating a field emission device as claimed in claim 2, wherein the step of removing the organic spreading liquid medium from the coating material includes the step of ashing the coating material.

4. The method for fabricating a field emission device as claimed in claim 2, wherein the step of depositing a coating material including an organic spreading liquid medium includes the step of depositing a coating material including a negative photoresist, and wherein the step removing the organic spreading liquid medium includes the step of removing the negative photoresist from the coating material, and further including, prior to the step of removing the organic spreading liquid medium, the steps of photo-exposing the coating material to collimated light having a wavelength suitable for activating the negative photoresist and thereafter developing the coating material.

5. The method for fabricating a field emission device as claimed in claim 1, wherein the step of depositing on the dielectric layer a sacrificial layer includes the step of depositing on the dielectric layer a metal being selected from a group consisting of aluminum, zinc, copper, tin, titanium, vanadium, and silver.

6. A method for fabricating a field emission device comprising the steps of:

providing a substrate having a surface;

forming on the surface of the substrate a cathode;

forming on the cathode a dielectric layer;

forming an emitter well in the dielectric layer;

forming within the emitter well an electron emitter structure having a surface;

forming on a portion of the dielectric layer a gate electrode;

depositing on the dielectric layer a sacrificial layer;

subsequent to the step of depositing the sacrificial layer, depositing on the surface of the electron emitter structure a coating material having passivation characteristics including an emission-enhancing oxide; and thereafter, removing the sacrificial layer.

7. The method for fabricating a field emission device as claimed in claim 6, wherein the step of depositing a coating material includes the step of depositing a coating material including an organic spreading liquid medium, and further including, subsequent to the step of depositing a coating material, the step of removing the organic spreading liquid medium from the coating material.

8. The method for fabricating a field emission device as claimed in claim 7, wherein the step of removing the organic spreading liquid medium from the coating material includes the step of ashing the coating material.

9. The method for fabricating a field emission device as claimed in claim 7, wherein the step of depositing a coating material including an organic spreading liquid medium includes the step of depositing a coating material including a negative photoresist, and wherein the step removing the organic spreading liquid medium includes the step of removing the negative photoresist from the coating material, and further including, prior to the step of removing the organic spreading liquid medium, the steps of photo-exposing the coating material to collimated light having a wavelength suitable for activating the negative photoresist and thereafter developing the coating material.

10. The method for fabricating a field emission device as claimed in claim 6, wherein the step of depositing on the dielectric layer a sacrificial layer includes the step of depositing on the dielectric layer a metal being selected from a group consisting of aluminum, zinc, copper, tin, titanium, vanadium, and silver.

11. A method for fabricating a field emission device comprising the steps of:

providing a substrate having a surface;

forming on the surface of the substrate a cathode;

forming on the cathode a dielectric layer;

forming an emitter well in the dielectric layer;

forming within the emitter well an electron emitter structure having a surface;

forming on a portion of the dielectric layer a gate electrode;

depositing on the dielectric layer a sacrificial layer;

subsequent to the step of depositing the sacrificial layer, depositing on the surface of the electron emitter structure a coating material having passivation characteristics including a precursor of an emission-enhancing oxide; and thereafter, removing the sacrificial layer.

12. The method for fabricating a field emission device as claimed in claim 11, further including, subsequent to the step of depositing a coating material, the step of converting the precursor of the emission-enhancing material to the emission-enhancing material.

13. The method for fabricating a field emission device as claimed in claim 12, wherein the step of depositing a coating material includes the step of depositing on the electron emitter structure a coating material including an organometallic material having a metallic chemical element, and wherein the step of converting the precursor of the emission-enhancing material includes the step of oxidizing the metallic chemical element of the organometallic material.

14. The method for fabricating a field emission device as claimed in claim 11, wherein the step of depositing a coating material includes the step of depositing a coating material including an organic spreading liquid medium, and further including, subsequent to the step of depositing a coating material, the step of removing the organic spreading liquid medium from the coating material.

15. The method for fabricating a field emission device as claimed in claim 14, wherein the step of removing the organic spreading liquid medium from the coating material includes the step of ashing the coating material.

16. The method for fabricating a field emission device as claimed in claim 14, wherein the step of depositing a coating material including an organic spreading liquid medium includes the step of depositing a coating material including a negative photoresist, and wherein the step removing the organic spreading liquid medium includes the step of removing the negative photoresist from the coating material, and further including, prior to the step of removing the organic spreading liquid medium, the steps of photo-exposing the coating material to collimated light having a wavelength suitable for activating the negative photoresist and thereafter developing the coating material.

17. The method for fabricating a field emission device as claimed in claim 11, wherein the step of depositing on the dielectric layer a sacrificial layer includes the step of depositing on the dielectric layer a metal being selected from a group consisting of aluminum, zinc, copper, tin, titanium, vanadium, and silver.

* * * * *